United States Patent [19]

Lenz

[11] Patent Number: 4,791,381

[45] Date of Patent: Dec. 13, 1988

[54] INTEGRATED AMPLIFIER CIRCUIT

[75] Inventor: Michael Lenz, Munich, Fed. Rep. of Germany

[73] Assignee: Siemens Aktiengesellschaft, Berlin and Munich, Fed. Rep. of Germany

[21] Appl. No.: 144,608

[22] Filed: Jan. 11, 1988

Related U.S. Application Data

[63] Continuation of Ser. No. 844,028, Mar. 25, 1986, abandoned.

[30] Foreign Application Priority Data

Mar. 27, 1985 [DE] Fed. Rep. of Germany ....... 3511189

[51] Int. Cl.$^4$ .............................................. H03F 3/68
[52] U.S. Cl. ..................................... 330/84; 330/108; 330/146; 330/295; 330/297
[58] Field of Search .................... 330/84, 108, 124 R, 330/146, 261, 295, 297, 307, 256, 289

[56] References Cited

U.S. PATENT DOCUMENTS 4,496,911  1/1985  Lenz .................................... 330/297
4,539,529  9/1985  Lenz .................................... 330/295

FOREIGN PATENT DOCUMENTS 0106088  4/1984  European Pat. Off. .

OTHER PUBLICATIONS

Patents Abstract of Japan, vol. 5, No. 59, Apr. 22, 1981.
Der Elektroniker, vol. 15, No. 11, Nov. 76.
Electronigue Applications, No. 32, Oct.–Nov. 1983.

*Primary Examiner*—James B. Mullins

*Attorney, Agent, or Firm*—Herbert L. Lerner; Laurence A. Greenberg

[57] ABSTRACT

An integrated amplifier circuit includes:
first and second operational amplifiers each having a terminal connected to a supply potential node, and a terminal connected to a reference potential node;
two ohmic voltage dividers each being formed of two resistors connected between an output of a respective one of the operational amplifiers and a first circuit node, and two further ohmic resistors each being connected between a respective tap of the voltage dividers and a respective inverting input of a respective one of the operational amplifiers, providing real negative feedback of the operational amplifiers;
a third ohmic voltage divider formed of two resistors connected between a supply potential node and the first circuit node, an intermediate ohmic resistor connected between a tap of the third voltage divider and a second circuit node, and two ohmic supply resistors each being connected between the second circuit node and a respective non-inverting input of the operational amplifier; an ohmic series resistor connected to the inverting input of the first operational amplifier;
terminals connected to outputs of the operational amplifiers, terminals connected to the supply and reference potential nodes for connection to a supply voltage source, terminals connected to the first and second circuit nodes, and a single fourth terminal connected to the series resistor and to the non-inverting input of the second operational amplifier for feeding in a signal.

10 Claims, 3 Drawing Sheets

INTEGRATED AMPLIFIER CIRCUIT

This application is a continuation of application Ser. No. 844,028 filed Mar. 25, 1986 now abandoned.

The invention relates to an integrated amplifier circuit, including:

first and second operational amplifiers, each having an inverting input, a non-inverting input, an output as well as connections to nodes for connecting a supply potential and a reference potential;

two ohmic voltage dividers each formed of two resistors connected from a respective output to a first node, and two further ohmic resistors each connected from the tap of a respective voltage divider to the inverting input of the respective operational amplifier, providing a real negative feedback of the two operational amplifiers;

a further ohmic voltage divider formed of two resistors connected between the node for connecting the supply potential and the first node, the tap of the further voltage divider being connected through an intermediate ohmic resistor to a second node, and the second node also being connected through respective ohmic supply resistors to the non-inverting inputs of the two operational amplifiers;

an ohmic series resistor connected to the inverting input of the first operational amplifier; and terminals for feeding-in a signal, terminals for taking off two signals at the outputs of the operational amplifiers, terminals for connecting the nodes for supply and reference potentials of a supply voltage source, and terminals for connecting the first and the second nodes.

Such a circuit requires a special housing because the circuit can only be operated through external wiring which must be connected to nine external wiring pins. The power output of such a device is also limited.

It is accordingly an object of the invention to provide an integrated amplifier circuit, which overcomes the hereinafore-mentioned disadvantages of the heretofore-known devices of this general type, which can be operated as a bridge amplifier and which requires only seven contact pins for external wiring required for operation. It should also be possible to use the integrated amplifier circuit for a stereo amplifier which makes an output power available that is considerably larger than in the prior art.

With the foregoing and other objects in view there is provided, in accordance with the invention, an integrated amplifier circuit, comprising:

a first circuit node, a second circuit node, a supply potential node, and a reference potential node;

first and second operational amplifiers each having an inverting input, a non-inverting input, an output, a terminal connected to the supply potential node, and a terminal connected to the reference potential node;

two first ohmic voltage dividers each being formed of two resistors with a tap therebetween, each first voltage divider having one end connected to an output of a respective one of the operational amplifiers and another end connected to the first circuit node, and two further ohmic resistors each being connected between a respective one of the taps and a respective inverting input of a respective one of the operational amplifiers, providing real negative feedback of the operational amplifiers;

a third ohmic voltage divider formed of two resistors with a tap therebetween, the third voltage divider having one end connected to the supply potential node and another end connected to the first circuit node, an intermediate ohmic resistor connected between the tap of the third voltage divider and the second circuit node, and two ohmic supply resistors each being connected between the second circuit node and a respective non-inverting input of the operational amplifiers;

an ohmic series resistor connected to the inverting input of the first operational amplifier;

first terminals each being connected to a respective one of the outputs of the operational amplifiers, second terminals each being connected to a respective one of the supply and reference potential nodes for connection to a supply voltage source, third terminals each being connected to a respective one of the first and second circuit nodes, and a single fourth terminal connected to the series resistor and to the non-inverting input of the second operational amplifier for feeding in a signal.

The integrated amplifier circuit according to the invention can be integrated for operation as a bridge circuit into a seven-pin housing, such as a TO 220/7 housing. The minor external wiring of the integrated amplifier circuit which is still required according to the invention and the low heat resistance of the TO 220/7 power casing, offer further user-friendly advantages. It is the basic idea of the invention for the operational amplifiers according to the prior art to have a purely real input impedance which is considerably higher than the respective supply resistors in the low-frequency range of interest, i.e., at frequencies below 100 kHz. In the operation as a bridge amplifier, i.e., for inverting operation of the first operational amplifier and non-inverting operation of the second operational amplifier, the capacitor connected to the non-inverting input of the first operational amplifier required in the prior art is not required because a terminal connected to the non-inverting input of the first operational amplifier does not have to be connected to reference potential. Along with the capacitor, the terminal of the integrated amplifier circuit which is connected thereto can also be omitted.

In accordance with another feature of the invention, the operational amplifiers are identical, the resistors of the first voltage dividers are identical, the further resistors are identical, and the supply resistors are identical.

In accordance with a further feature of the invention, each of the further resistors has a resistance value equal to the sum of the resistance value of one of the supply resistors and twice the resistance value of the intermediate resistor.

In accordance with an added feature of the invention, the further resistors each have a resistance value equal to the resistance value of the series resistor.

In accordance with an additional feature of the invention, the first node is the reference point of the voltage dividers and the third terminal connected to the first node is connected to a reference potential of the supply voltage source.

In accordance with again another feature of the invention, the operational amplifiers have input and output stages with reference points, the reference potential node is connected to reference points of the output stages of the operational amplifiers, the first node is connected to the reference potential of the supply voltage source, the reference potential node and the first node are also the reference point of the voltage dividers and of the input stages of the operational amplifiers, and the reference potential node, the first node and the terminals connected thereto are not interconnected in the integrated amplifier circuit.

In accordance with again a further feature of the invention, the reference potential node is a cooling strap.

In accordance with again an added feature of the operation, there is provided a case and another integrated amplifier circuit connected to the first-mentioned amplifier circuit as a stereo amplifier circuit in the case.

In accordance with again an additional feature of the invention, there is provided a case and another integrated amplifier circuit connected to the first-mentioned amplifier circuit as a stereo amplifier circuit in the case, the other integrated amplifier circuit having no second and third terminals, no third voltage divider and no intermediate resistor, but being otherwise identical to the first-mentioned integrated amplifier circuit, and the first, second, supply potential and reference potential nodes of the other integrated amplifier circuit being connected to the terminals connected to the corresponding nodes of the firstmentioned integrated amplifier circuit.

In accordance with a concomitant feature of the invention, there is provided a chip in the case on which the stereo amplifier circuit is disposed.

Other features which are considered as characteristic for the invention are set forth in the appended claims.

Although the invention is illustrated and described herein as embodied in an integrated amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of the drawings, in which.

Figure 1:
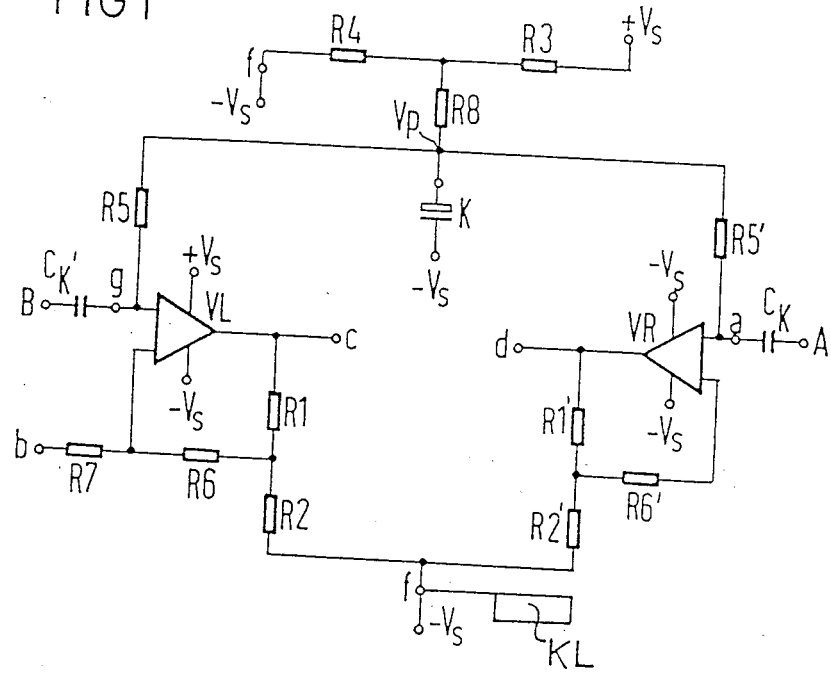
FIG. 1 is a schematic circuit diagram of an integrated amplifier circuit according to the prior art.

Referring now to the figures of the drawings in detail and first, particularly, to FIG. 1 thereof, there is seen a circuit which is known from German Published, No-Prosecuted Application No. DE-OS 32 34 400 corresponding to U.S. Pat. No. 4,539,529. The FIG. 1 circuit contains two identical operational amplifiers VL and VR, bearing the conventional symbol "+" for the non-inverting inputs thereof and "−" for the inverting inputs thereof. An output c of the operational amplifier VL is connected to the inverting input of the operational amplifier VL through a series connection of two resistors R1 and R6. The junction point between the two resistors R1 and R6 is furthermore connected through a resistor R2 to a terminal f of the integrated amplifier circuit which is connected to a reference potential $-V_S$. The resistors R1 and R2 represent an ohmic voltage divider and the resistors R1 and R2 together with the resistor R6, represent a real negative feedback network for the operational amplifier VL. In addition, the inverting input of the operational amplifier VL is connected through a series resistor R7 to a terminal b, at which a signal for the inverting operation of the amplifier VL can be fed in.

In the other operational amplifier VR, the signal output d is similarly connected through a series connection of two resistors R1' and R2' forming an ohmic voltage divider, to the terminal f and to the reference potential $-V_S$. The divider tap of the ohmic voltage divider is connected to the inverting input of the operational amplifier VR through a resistor R6'.

Non-inverting signal inputs g and a of the two operational amplifiers VL and VR are connected to terminals B and A, respectively, through which input signals can be fed in, such as through respective capacitors $C_K'$ and and $C_K$ belonging to the external wiring of the integrated amplifier circuit. In addition, the two non-inverting inputs are connected through respective supply resistors R5 and R5' to a node which is supplied with a divided-down supply potential $V_P$ and is connected to a terminal e of the integrated amplifier circuit. The divided-down supply potential $V_P$ is derived through an intermediate ohmic resistor R8 from the divider point of an ohmic voltage divider formed by two resistors R3 and R4. The end of the resistor R3 facing away from the resistor R8 is connected to a supply potential $+V_S$, and the end of the resistor R4 facing away from the resistor R8 is connected through a terminal f of the integrated amplifier circuit to the reference potential $-V_S$.

In order to smooth the potential $V_P$, the node connected to the terminal e of the integrated amplifier circuit can be connected to the reference potential $-V_S$ through a capacitor K. The two operational amplifiers VL and VR receive their supply voltage by connecting one terminal to the supply potential $+V_S$ and another terminal to the reference potential $-V_S$. It is known from German Published, Non-Prosecuted Application No. DE-OS 32 35 289 corresponding to U.S. Pat. No. 4,496,911, to connect the output stages of the operational amplifiers directly to the reference potential $-V_S$ through a separate terminal while the input stages of the operational amplifiers are connected to the reference potential $-V_S$ through the terminal f, mentioned in connection with the ohmic voltage dividers.

If the amplifier circuit is operated as a stereo amplifier, the operational amplifiers are driven in phase and the signal outputs of the operational amplifiers each operate through the terminals c and d on a load element, such as a respective loudspeaker, the other lead of which is connected to the reference potential $-V_S$. If the amplifier circuit is operated as a bridge amplifier, the operational amplifiers are driven with opposite phases and the signal outputs of the operational amplifiers work on the two terminals of a single load element through the terminals c and d.

The circuit described in FIG. 1 can be integrated with the exception of the capacitors. Design rules given in German Published, Non-Prosecuted Application No. DE-OS 32 34 400 corresponding to U.S. Pat. No. 4,539,529 can be used for selecting the resistors. However, such a circuit requires a special housing because the operation of the circuit is only possible through the external wiring which must be connected to nine terminal pins.

In the embodiment of the integrated amplifier circuit according to the invention, elements which are the same as those in FIG. 1 are provided with the same reference symbols. The integrated amplifier circuit is contained in a block enclosed by broken lines in FIG. 2. The two operational amplifiers VL and VR with their non-inverting and inverting inputs as well as the real negative feedback provided by the resistors R1, R2 and R6 as well as the resistors R1', R2' and R6' correspond to FIG. 1. A first node interconnecting the base points of the two voltage dividers, i.e., the first node interconnecting the resistors R2 and R2', is connected to the terminal f and the outputs of the operational amplifier VL and VR are connected to the terminals c and d of the integrated amplifier circuit IS.

The two undesignated terminals of the amplifiers are connected to the supply voltage with the supply potential $+V_S$ and the reference potential $-V_S$. The supply voltage present at the undesignated terminals of the amplifiers is fed to the two operational amplifiers VL and VR through the internal connections iV which are not explained herein in detail. The terminal in the block iV designated with reference symbol "+" is connected to the ohmic voltage divider formed of the resistors R3 and R4 connected to the first node and to the terminal f. The potential $V_P$ which is connected to a second node is taken off at the divider point of the voltage divider R3, R4. The second node is furthermore connected to the terminal e of the integrated circuit IS and the second node is connected through the two supply resistors R5 and R5' to the non-inverting inputs of the operational amplifiers VL and VR, respectively.

A resistor R7 connects the inverting input of the operational amplifier VL to the non-inverting input of the operational amplifier VR and to a terminal h of the integrated circuit, which represents the signal input terminal.

The internal connection or network iV which is not shown in detail and which ensures the voltage supply for the operational amplifiers VL and VR, can be formed of two nodes which distribute the connecting lines for the supply potential and the reference potential among the two operational amplifiers. As will be explained in detail in connection with FIG. 3, in another embodiment only the output stages of the operational amplifiers are connected to the node for the reference potential $-V_S$, while the input stages of the operational amplifiers are each connected through an additional line to the first node and to the terminal f, in a manner which is not shown in FIG. 2.

The selection of the resistors R1 to R8 as well as R1', R2', R5' and R6' of the integrated amplifier circuit can be made as described in German Published, Non-Prosecuted Application No. DE-OS 32 34 400, corresponding to U.S. Pat. No. 4,539,529. Through the use of the resistors designated above, the external wiring of the operational amplifiers is almost completely integrated.

Due to the internal connection of the signal input terminal h of the integrated circuit IS to the inverting input of the operational amplifier VL and to the non-inverting input of the operational amplifier VR, the two operational amplifiers are driven with opposite phases and the integrated circuit operates as a bridge amplifier. Since the circuit is constructed for the low-frequency range below 100 kHz, in which the input impedance of the operational amplifiers is real and substantially higher than the resistance of the resistor R5, capacitive grounding of the non-inverting input of the operational amplifier VL can be omitted along with a terminal which would be connected thereto. A current flowing through the resistor R7 disappears if the offset quantities of the rest of the circuit go toward zero. In quantity production of the integrated circuit IS, the absolute amounts of the d-c output voltages are scattered more than with a bridge amplifier circuit according to the state of the art; however, the output difference voltage which is the determining factor for a bridge amplifier, is hardly influenced in an integrated amplifier circuit according to the invention.

Figure 2:
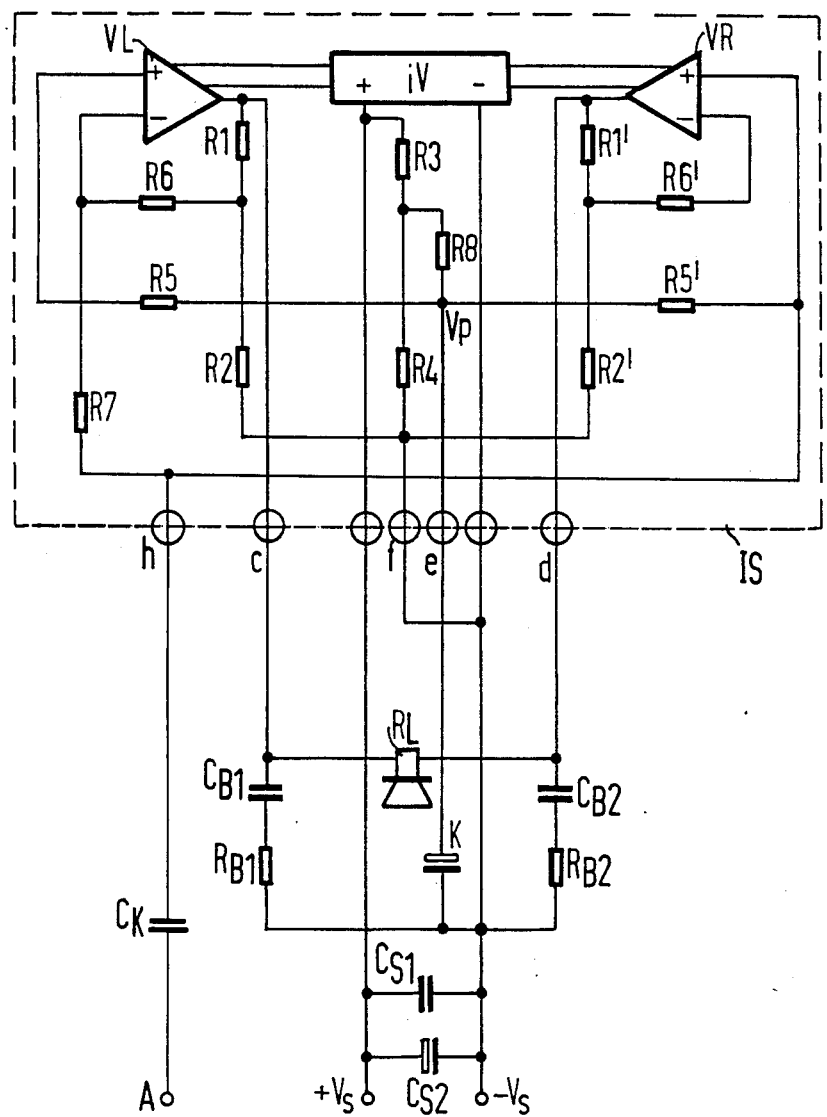
FIG. 2 is a circuit diagram of the integrated amplifier circuit according to the invention with external wiring required for an application of the circuit.

Besides the integrated circuit IS, FIG. 2 shows external wiring for a loudspeaker provided as a load element $R_L$, which is to be considered as an example of an application for the circuit. To this end, the terminals c and d of the integrated circuit which are connected to the outputs of the operational amplifiers, are each connected to a terminal of the loudspeaker RL. Series circuits formed of a capacitor and a resistor which are designated by reference symbol $C_{B1}$ and $R_{B1}$ as well as $C_{B2}$ and $R_{B2}$, are each connected between a respective one of the terminals c and d and the reference potential $-V_S$. A capacitor K is also connected from the terminal e of the integrated circuit IS which carries the potential $V_P$, to the reference potential $-V_S$. The capacitor K serves for smoothing the voltage between the node at the potential $V_P$ and the reference potential $-V_S$ and it substantially determines the switching-on properties of the integrated circuit. The reference potential $-V_S$ and the supply potential $+V_S$ can be connected to two terminals which in turn are connected with the undesignated terminals of the integrated amplifier circuit IS. Filter capacitors $C_{S1}$ and $C_{S2}$ which are to block supply voltage peaks and fluctuations, are connected between the two terminals for the supply and the reference potential. The signal input terminal h is connected to a signal generator through a coupling capacitor $C_K$ and a terminal A. In the illustrated embodiment, the terminal f of the integrated circuit IS which can be connected to a potential, is externally connected to the reference potential $-V_S$.

Figure 3:
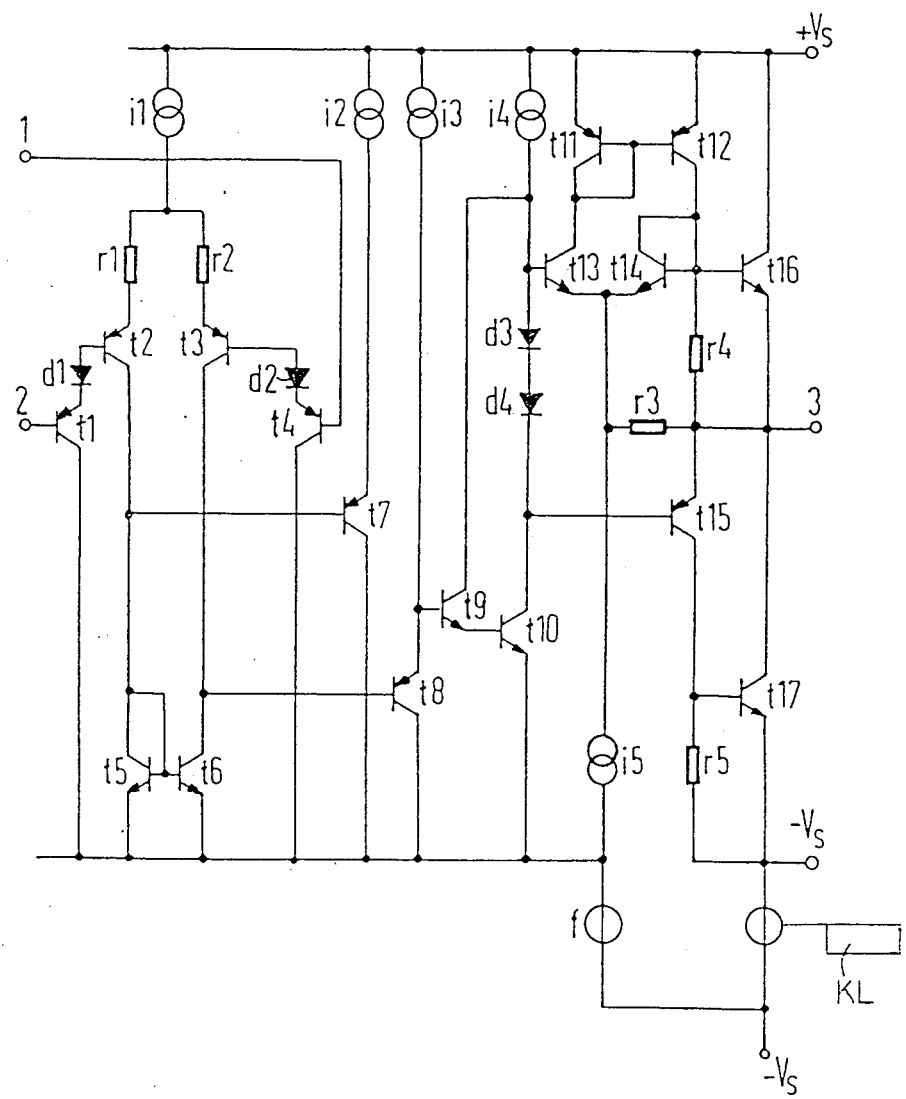
FIG. 3 is a circuit diagram of an embodiment of one of the two operational amplifiers of the circuit.

An embodiment of the structure of the circuit of the operational amplifiers VL and VR is shown in FIG. 3. The circuit is constructed in complementary bipolar technology.

A non-inverting input 1 of such an amplifier drives the base of a first pnp transistor t4, the collector of which is connected to the reference potential $-V_S$. The emitter of the transistor t4 is connected to the cathode of a diode d2 and through the diode d2 to the base of a second pnp transistor t3. The circuit of an inverting input 2 corresponds to that of the non-inverting input 1. The input 2 therefore forms the base terminal of a third pnp transistor t1, the collector of which is also connected to the reference potential $-V_S$. The emitter of the transistor t1 is connected to the cathode of a diode d1 and through the diode d1 to the base of a fourth pnp transistor t2.

The emitter of the second pnp transistor t3 is connected through a series circuit of two identical resistors r2, r1 to the emitter of the fourth pnp transistor t2. In addition, the junction point between the two resistors r1 and r2 is connected through a constant-current source i1 to the terminal for connecting the supply potential $+V_S$. The reference potential $-V_S$ for the first pnp transistor t4 and the third pnp transistor t1 is taken from the terminal f of the integrated circuit IS according to FIG. 2.

The collector of the second pnp transistor t3 is connected to the collector of a first npn transistor t6. The base of the transistor t6 is connected to the base and to the collector of a second npn transistor t5 which is connected as a diode and to the collector of the fourth pnp transistor t2. The emitters of the transistors t5 and t6 are likewise connected through the terminal f to the reference potential $-V_S$ for the integrated circuit.

The collector of the second pnp transistor t3 as well as the collector of the fourth pnp transistor t2 each drive the base of a respective further pnp transistor t7 and t8. The emitter of the pnp transistor t7 which is driven by the fourth pnp transistor t2, is connected through a current source i2 to the terminal for the supply potential $+V_S$. The collector of the transistor t7 is connected to the terminal f with the reference potential $-V_S$. The emitter of the pnp transistor t8 which is driven by the second pnp transistor t3, is connected through a further current source i3 to the terminal for the supply potential $+V_S$. The collector of the transistor t8 is connected to the above-mentioned terminal f. However, in contrast to the pnp transistor t7, the emitter of the pnp transistor t8 is also connected to the base of a third npn transistor t9, while no further connection is provided for the transistor t7.

The emitter-collector path of the third npn transistor t9 is shunted by a series circuit of two diodes d3 and d4 poled in the same direction and the base-collector diode of a fourth npn transistor t10. To this end, the collector of the third npn transistor t9 is connected through a fourth constant-current source i4 to the terminal for the supply potential $+V_S$ and is also connected to the anode of the diode d3. The cathode of the diode d4 which is in series with the diode d3 and is poled in the same direction as the diode d3, is connected to the collector of the fourth npn transistor t10. The base of the fourth npn transistor t10 is connected to the emitter of the third npn transistor t9, and the emitter of the transistor t10 is connected to the terminal f. The collector of the transistor t10 is connected to the base of a seventh pnp transistor t15.

On the other hand, the collector of the third npn transistor t9 is connected to the base of a fifth npn transistor t13. The transistor t13, together with a sixth npn transistor t14, forms an emitter-coupled differential amplifier, the two emitters of which are connected through a fifth current source i5 to the abovementioned terminal f and to the reference potential $-V_S$. The collector of the fifth npn transistor t13 is connected to the base and to the collector of an eighth pnp transistor t11 which is connected as a diode. The emitter of the transistor t11 is connected to the terminal for the supply potential $+V_S$ and the base and the collector of the transistor t11 are additionally connected to the base of a ninth pnp transistor t12. The emitter of the pnp transistor t12 is also directly acted upon by the supply potential $+V_S$ and the collector thereof is directly connected to the collector and the base of the sixth npn transistor t14, which is connected as a diode.

The output stage of the operational amplifier includes seventh and eight npn transistors t16 and t17 which are connected in series with respect to their emitter-collector paths. The collector of the seventh npn transistor t16 is connected to the terminal for the supply potential $+V_S$ and its emitter is connected to a signal output 3 of the respective operational amplifier. On the other hand, the emitter of the eighth npn transistor t17 is directly connected through an undesignated terminal to the terminal for connecting reference potential $-V_S$, according to German Published, Non-Prosecuted Application No. DE-OS 32 35 289, corresponding to U.S. Pat. No. 4,496,911. The collector of the eighth npn transistor t17 is directly connected to the signal output 3 of the operational amplifier; the base of the transistor t17 is connected through a resistor r5 to the emitter of the transistor t17 and to an undesignated terminal for connecting the reference potential $-V_S$. In addition, the base of the npn transistor t17 is connected to the collector of the seventh pnp transistor t15 which also belongs to the output stage.

The base of the seventh npn transistor t16 is also connected through a resistor r4 to the emitter of the transistor t16 and to the signal output 3 of the operational amplifier as well as to the emitter of the seventh pnp transistor t15. In addition, the base of the seventh npn transistor t16 is connected to the collector and to the base of the sixth npn transistor t14. Finally, the signal output 3 of the operational amplifier is connected through a resistor r3 to the emitters of the fifth and the sixth npn transistors t13 and t14, respectively. The structure of the operational amplifier according to FIG. 3 has the following advantages:

The diodes d1 and d2 ensure that the common-mode range in the input terminals 1 and 2 of the operational amplifier extends to the reference potential $-V_S$.

An offset is minimized by the provision that the base currents of the transistors t5 and t6 are compensated for the typical current gain over the emitter/area ratio of these transistors and the provision that the base current of the pnp transistor t8 is compensated by the base current of the pnp transistor t7, the collector current of which is equal to the collector current of the transistor t8.

On the other hand, however, it is also possible to conduct the line leading to the terminal f directly to the undesignated terminal for connecting the reference potential $-V_S$ as in FIG. 2. However, since the current through the output stage of the operational amplifier exceeds all other currents of the integrated amplifier circuit by several orders of magnitude, this then leads to a coupling of the input stage current to the current in the output stage, due to the parasitic properties of the operational amplifier. This coupling leads to a bothersome increase of the distortion of the amplifier circuit, which is particularly noticeable if such a circuit is used as an output amplifier for radio and television purposes. Besides decoupling, the circuit according to FIG. 3 has the further advantage of connecting the undesignated terminal to the cooling strap KL of the integrated circuit in a conducting manner and permitting the undesignated terminal to be provided for connecting the reference potential $-V_S$ of the operational amplifier.

The output power of the amplifier circuit IS according to FIG. 2 is about 15W for a load resistance $R_L$ of 4 ohms and a supply voltage of 14.4V, or about 30W for a load resistance $R_L$ of 8 ohms and a supply voltage of 25V.

Figure 4:
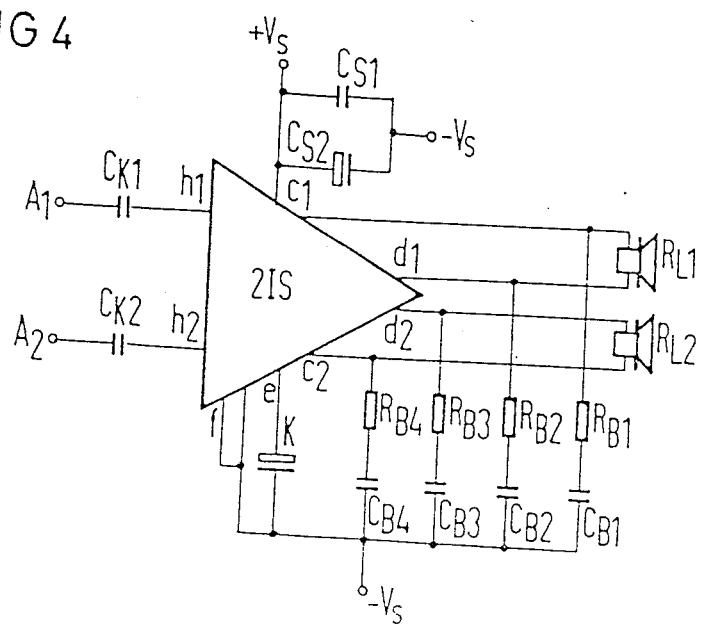
FIG. 4 is a circuit diagram of an embodiment of a stereo amplifier circuit with external wiring which is provided by using the amplifier circuit that is integrated according to the invention.

In order to illustrate further applications for the high output power of the amplifier circuit IS shown in FIG. 2 according to the invention, FIG. 4 shows the use of the integrated amplifier circuit in a stereo amplifier. The elements in FIG. 4 are again provided with the same reference symbols as similar elements in FIGS. 2 and 1. In FIG. 4, the element 2IS which is designated with an amplifier symbol contains two of the integrated amplifier circuits IS shown in FIG. 2, each forming a partial circuit with the following pecularities:

Both partial circuits according to FIG. 2 are supplied with voltage through two undesignated terminals, so that the voltage is fed to the two partial circuits through the internal connection iV;

The bases of the ohmic voltage dividers of the two partial circuits are brought to a common first node which is connected to a terminal f;

The divided-down supply potentials $V_P$ of both partial circuits are brought to a common node which is connected to a single terminal e;

An ohmic voltage divider formed of the resistors R3 and R4 and an intermediate resistor R8, are sufficient for leading off the divided-down supply potential $V_P$;

In order to filter the divided supply potential $V_P$, the terminal e is connected to the reference potential $-V_S$ through a single capacitor K; and The supply voltage is filtered as in FIG. 2 by means of the two filter capacitors $C_{S1}$ and $C_{S2}$.

All other elements of the amplifier circuit 2IS and its external wiring correspond to doubling the partial circuit according to FIG. 2. The inputs and outputs are designated as in FIG. 2 and the subscript designates the respective partial circuit. The series circuit formed of a capacitor and a resistor leading from the respective output terminals to the reference potential $-V_S$ is always designated in the partial elements with subscripts 1 to 4.

However, 7 contact pins are no longer sufficient for the stereo amplifier circuit 2IS according to FIG. 4, since two outputs and one input are additionally required. For this reason, a special casing is again required in this case; however, the stereo amplifier circuit 2IS provides a considerably higher output power than in the state of the art.

The foregoing is a description corresponding in substance to German Application No. P 35 11 189.5, filed Mar. 27, 1985, the International priority of which is being claimed for the instant application and which is hereby made part of this application. Any material discrepancies between the foregoing specification and the afore-mentioned corresponding German application are to be resolved in favor of the latter.

I claim:

1. Integrated amplifier circuit assembly, comprising at least a first integrated amplifier circuit including:
    a first circuit node, a second circuit node, a supply potential node, and a reference potential node; first and second operational amplifiers each having a inverting input, a non-inverting input, an output; a terminal connected to said supply potential node, and a terminal connected to said reference potential node;
    two first ohmic voltage dividers each being formed of two resistors with a tap therebetween, each first voltage divider having one end connected to an output of a respective one of said operational amplifiers and another end connected to said first circuit node, and two further ohmic resistors each being connected between a respective one of said taps and a respective inverting input of a respective one of said operational amplifiers, providing real negative feedback to said operational amplifiers; and
    two ohmic supply resistors each being connected between second circuit node and a respective non-inverting input of said operational amplifiers;
    said integrated amplifier circuit assembly including a third ohmic voltage divider formed of two resistors with a tap therebetween, said third voltage divider having one end connected to said supply potential node and another end connected to said first circuit node, an intermediate ohmic resistor connected between said tap of said third voltage divider and said second circuit node;
    the integrated amplifier circuit further including an ohmic series resistor connected to said inverting input of said first operational amplifier;
    first terminals each being connected to a respective one of said outputs of said operational amplifiers, second terminals each being connected to a respective one of said supply and reference potential nodes for connection to a supply voltage source, third terminals each being connected to a respective one of said first and second circuit nodes, and a single fourth terminal connected to said ohmic series resistor and to said non-inverting input of said second operational amplifier via connections internal to said integrated amplifier circuit, for feeding in a signal.

2. Integrated amplifier circuit assembly according to claim 1, wherein said operational amplifiers are identical, said resistors of said first voltage dividers are identical, said further resistors are identical, and said supply resistors are identical.

3. Integrated amplifier circuit assembly according to claim 2, wherein each of said further resistors has a resistance value equal to the sum of the resistance value of one of said supply resistors and twice the resistance value of said intermediate resistor.

4. Integrated amplifier circuit assembly according to claim 1, wherein each of said further resistors has a resistance value equal to the sum of the resistance value of one of said supply resistors and twice the resistance value of said intermediate resistor.

5. Integrated amplifier circuit assembly according to claim 1, wherein said further resistors each have a resistance value equal to the resistance value of said series resistor.

6. Integrated amplifier circuit assembly according to claim 3, wherein said further resistors each have a resistance value equal to the resistance value of said series resistor.

7. Integrated amplifier circuit assembly according to claim 1, wherein said first node is the reference point of said first voltage dividers and said third terminal connected to said first node is connected to a reference potential of said supply voltage source.

8. Integrated amplifier circuit assembly according to claim 1, including a reference point of said first voltage dividers, wherein said operational amplifiers have input and output stages with reference points, said reference potential node is connected to said reference points of said output stages of said operational amplifiers, said first node is connected to the reference potential node, said reference potential node and said first node are also the reference point of said first voltage dividers and of said input stages of said operational amplifiers, and said reference potential node, said first node and said terminals connected thereto are not interconnected in the integrated amplifier circuit.

9. Integrated amplifier circuit assembly according to claim 1, including another integrated amplifier circuit connected to said first-mentioned amplifier circuit wherein said other integrated amplifier circuit shares said second and third terminals, said third voltage divider and said intermediate resistor with said first-mentioned amplifier circuit and is identical to said first-mentioned integrated amplifier circuit; and said first, second, supply potential and reference potential nodes of said other integrated amplifier circuit is connected to said terminals connected to said corresponding nodes of said first-mentioned integrated amplifier circuit; thereby forming an integrated stereo amplifier circuit assembly.

10. Integrated amplifier circuit assembly, comprising at least a first integrated amplifier circuit including:
a first circuit node, a second circuit node, a supply potential node, and a reference potential node;
first and second operational amplifiers each having an inverting input, a non-inverting input, an output; a terminal connected to said supply potential node, and a terminal connected to said reference potential node;
two first ohmic voltage dividers each being formed of two resistors with a tap therebetween, each first voltage divider having one end connected to an output of a respective one of said operational amplifiers and another end connected to said first circuit node, and two further ohmic resistors each being connected between a respective one of said taps and a respective inverting input of a respective one of said operational amplifiers, providing real negative feedback to said operational amplifiers; and two ohmic supply resistors each being connected between said second circuit node and a respective non-inverting input of said operational amplifiers;
said integrated circuit assembly including a third ohmic voltage divider formed of two resistors with a tap therebetween, said third voltage divider having one end connected to said supply potential node and another end connected to said first circuit node, an intermediate ohmic resistor connected between said tap of said third voltage divider and said second circuit node;
the integrated amplifier circuit further including an ohmic series resistor to said inverting input of said first operational amplifier; first terminals each being connected to a respective one of said outputs of said operational amplifiers, second terminals each being connected to a respective one of said supply and reference potential nodes for connection to a supply voltage source, third terminals each being connected to a respective one of said first and second circuit nodes, and a single fourth terminal connected to said ohmic series resistor and to said non-inverting input of said second operational amplifier via connections internal to said integrated amplifier circuit, for feeding in a signal; a cooling strap for cooling the circuit, said cooling strap being conductively connected with the terminal of each amplifier for connection to the reference potential node.

* * * * *